(12) United States Patent
Reinmuth et al.

(10) Patent No.: US 8,563,344 B2
(45) Date of Patent: Oct. 22, 2013

(54) METHOD FOR PRODUCING MEMS STRUCTURES, AND MEMS STRUCTURE

(75) Inventors: Jochen Reinmuth, Reutlingen (DE); Heiko Stahl, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 160 days.

(21) Appl. No.: 13/298,571

(22) Filed: Nov. 17, 2011

(65) Prior Publication Data

US 2012/0133002 A1 May 31, 2012

(30) Foreign Application Priority Data

Nov. 26, 2010 (DE) .......................... 10 2010 062 062

(51) Int. Cl.
*H01L 21/00* (2006.01)
*H01L 29/84* (2006.01)
*G01P 15/125* (2006.01)

(52) U.S. Cl.
USPC .... 438/50; 73/514.32; 73/514.35; 73/514.37; 73/514.38; 257/415; 257/420

(58) Field of Classification Search
USPC .................. 438/50; 257/415, 420; 73/514.32, 73/514.35, 514.37, 514.38
See application file for complete search history.

(56) References Cited

U.S. PATENT DOCUMENTS

| | | | | |
|---|---|---|---|---|
| 7,617,729 | B2 * | 11/2009 | Axelrod et al. | 73/514.32 |
| 7,824,943 | B2 * | 11/2010 | Lutz et al. | 438/48 |
| 7,892,876 | B2 * | 2/2011 | Mehregany | 438/51 |
| 8,138,007 | B2 * | 3/2012 | Geisberger | 438/52 |
| 8,173,470 | B2 * | 5/2012 | Mehregany | 438/51 |
| 8,372,677 | B2 * | 2/2013 | Mehregany | 438/51 |
| 8,397,570 | B2 * | 3/2013 | Verjus et al. | 73/510 |
| 8,413,509 | B2 * | 4/2013 | Geisberger | 73/514.32 |

FOREIGN PATENT DOCUMENTS

| | | |
|---|---|---|
| DE | 10 2006 051 597 | 5/2008 |
| DE | 10 2008 054 553 | 6/2010 |

* cited by examiner

*Primary Examiner* — Evan Pert
(74) *Attorney, Agent, or Firm* — Kenyon & Kenyon LLP

(57) ABSTRACT

A method for producing microelectromechanical structures in a substrate includes: arranging at least one metal-plated layer on a main surface of the substrate in a structure pattern; leaving substrate webs open beneath a structure pattern region by introducing first trenches into the substrate perpendicular to a surface normal of the main surface in a region surrounding the structure pattern; coating the walls of the first trenches perpendicular to the surface normal of the main surface with a passivation layer; and introducing cavity structures into the substrate at the base of the first trenches in a region beneath the structure pattern region.

5 Claims, 4 Drawing Sheets

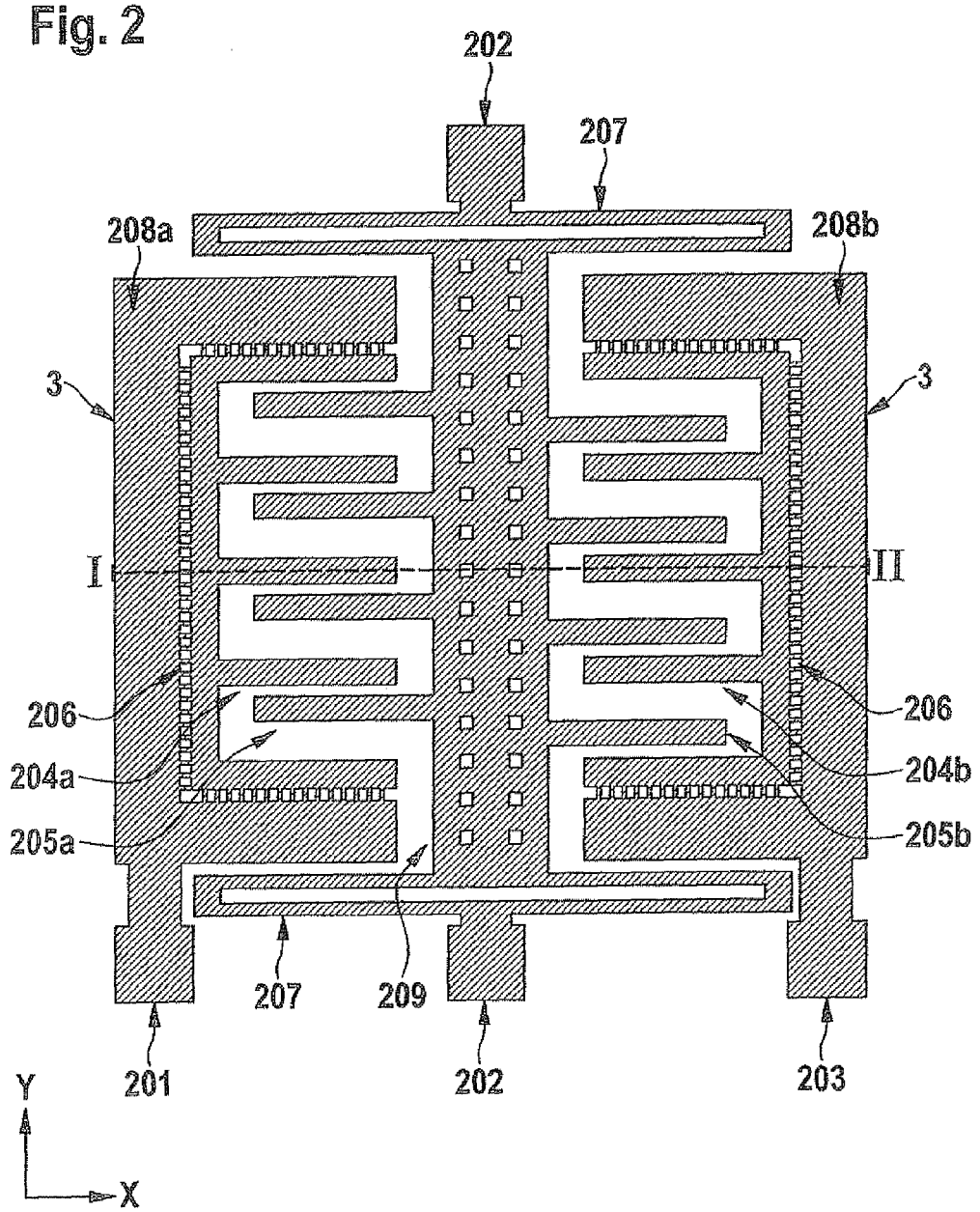

METHOD FOR PRODUCING MEMS STRUCTURES, AND MEMS STRUCTURE

BACKGROUND OF THE INVENTION

1. Field of the Invention

The present invention relates to a method for producing MEMS structures, in particular using CMOS processes, and a method for combined production of a CMOS structure and a MEMS structure.

2. Description of the Related Art

At the present time, microelectromechanical (MEMS) structures are frequently produced using CMOS technology. The metal printed conductors employed in a CMOS process may be used as movable structures as well as for forming electrodes. The dielectric layers, in particular the oxide layers, situated beneath the metal printed conductors may be used as a sacrificial layer in order to partially or completely leave the metal printed conductors open. With the aid of the CMOS technology, together with the MEMS structures, standard switching elements may also be produced which take over the control and evaluation of the MEMS element within a chip.

One important aspect in the use of metal printed conductors in MEMS structures is typically their mechanical properties, such as plasticity, brittleness, flexural strength, breaking strength, and the like. Another aspect is that vertically high structures having a height of greater than 5 μm and high aspect ratios (ratio of the vertical to the lateral extension) are not producible using conventional CMOS technology.

Another approach concerns the design of metal printed conductors which remain connected to a silicon substrate via oxide layers. With the aid of etching processes, the silicon in the substrate may be appropriately structured in order to form supporting silicon webs beneath the metal printed conductors. Published German patent application document DE 10 2008 054 553 A1, for example, discloses an acceleration sensor having movable and stationary electrodes in a substrate.

Published German patent application document DE 10 2006 051 597 A1 discloses a semiconductor system having a cantilevered microstructure above a substrate.

Front- and back-side processes are frequently necessary for producing MEMS structures, in particular in the production of undercut silicon structures for cantilevered elements.

BRIEF SUMMARY OF THE INVENTION

The present invention provides a method for producing microelectromechanical structures which is based on CMOS processes and which may be carried out using one-sided, in particular front-side, processes. In particular, with the aid of the method it is the aim for mechanical and electrostatic properties of the microelectromechanical structures to be adjustable in a simple and efficient manner.

For this purpose, it is a concept of the present invention to allow webs made of substrate material which are electrically insulated from the remainder of the substrate and electrically contactable to be provided beneath the microelectromechanical structures.

According to one specific embodiment, a method for producing microelectromechanical structures in a substrate includes arranging at least one metal-plated layer on a main surface of the substrate in a structure pattern, and leaving substrate webs open beneath a structure pattern region by introducing first trenches into the substrate perpendicular to a surface normal of the main surface in a region surrounding the structure pattern, coating the walls of the first trenches perpendicular to the surface normal of the main surface with a passivation layer, and introducing cavity structures into the substrate at the base of the first trenches in a region beneath the structure pattern region. In this way, it may be advantageously achieved that the structure patterns of the metal-plated layer on the surface of the substrate are extended into the interior of the substrate via the substrate webs. Since the substrate webs are left open and are not directly electrically coupled to the remainder of the substrate, the substrate webs together with the particular associated structure pattern region may act as an electrode, which significantly increases the electrode surface area compared to an electrode formed only from the structure pattern region. In addition, mechanical and electrostatic properties of the substrate webs may be adjusted in a flexible manner via the dimensioning of the first trenches and of the cavity structures.

It is particularly advantageous to provide metal-plated webs or metal webs within the metal-plated layer for mechanically connecting the structure pattern region to the substrate, the width of the metal-plated webs being smaller than the width of the structure pattern region, and to introduce second trenches into the substrate beneath the metal-plated webs. With the aid of the metal-plated webs, on the one hand a controlled electrical coupling to the circuit regions, which may be provided on the substrate, for example, may be created, and on the other hand the metal-plated webs establish a mechanically stable connection of the structure pattern regions and the substrate webs to the remainder of the substrate.

According to another specific embodiment, a semiconductor device includes a substrate having a main surface, a first microelectromechanical structure element having a first metal-plated layer and a first substrate web, situated beneath the first metal-plated layer, which is electrically decoupled from the substrate, and at least one metal-plated web which is narrower than the first microelectromechanical structure element and which electrically couples the first microelectromechanical structure element to the substrate. The semiconductor device offers the advantage of providing a microelectromechanical structure element which has a large electrode surface area, and which may advantageously be interconnected to form a capacitive sensor element via a second microelectromechanical structure element having a second metal-plated layer and a second substrate web, situated beneath the second metal-plated layer, which is electrically decoupled from the substrate. The second microelectromechanical structure element is advantageously movable with respect to the first microelectromechanical structure element, thus allowing a reliable and accurate acceleration sensor to be provided.

The above embodiments and refinements may be combined with one another, if appropriate.

BRIEF DESCRIPTION OF THE DRAWINGS

FIG. 2 shows a top view of a MEMS structure according to another specific embodiment of the present invention.

DETAILED DESCRIPTION OF THE INVENTION

Figure 1A:
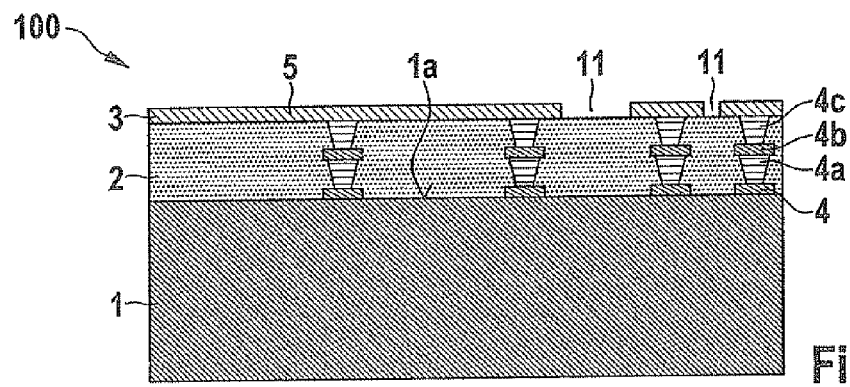
FIGS. 1a through 1f show schematic diagrams for illustrating method steps of a method for producing MEMS structures according to one specific embodiment of the present invention.

Unless stated otherwise, in each case identical and functionally equivalent elements, features, and components are provided with the same reference numerals in the figures. It is understood that for reasons of clarity and understandability, components and elements are not necessarily illustrated to scale relative to one another in the drawings.

FIGS. 1a through 1f show schematic diagrams for illustrating method steps of a method for producing MEMS structures in a substrate according to one specific embodiment of the present invention. A first method step 100 is shown in FIG. 1a. A substrate 1 having a main surface 1a is provided. One or multiple metal-plated layers 4, 4a, 4b, 4c is/are applied on main surface 1a of the substrate. In particular, metal-plated layers 4, 4a, 4b, 4c may include printed conductors on substrate 1. The structure of metal-plated layers 4, 4a, 4b, 4c may include different patterns, and may depend on the particular use of the MEMS structure to be produced. Metal-plated layers 4, 4a, 4b, 4c may be metal-plated levels in a CMOS process. Metal-plated layers 4, 4a, 4b, 4c may contain, for example, conductive materials such as aluminum, tungsten, titanium, copper, gold, platinum, or similar metals.

In addition, one or multiple dielectric layers 2 may be applied on main surface 1a of substrate 1. Dielectric layers 2 may be applied in particular between the structures of metal-plated layers 4, 4a, 4b, 4c, and may terminate flush with the metal-plated layer. Dielectric layers 2 may include oxide layers, for example, such as silicon oxide layers, for example.

A metal-plated layer 3 is applied on the side of main surface 1a of substrate 1. Metal-plated layer 3 may be applied, for example, on metal-plated layer 4c and/or dielectric layer 2. Metal-plated layer 3 may be structured in order to meet predefined constraints imposed by the use of the MEMS structure. For example, thin metal-plated webs may be provided in a region 5 which electrically connect two metal-plated regions of metal-plated layer 3 to one another. Metal-plated layer 3 may also be structured in such a way that regions 11 remain open, and a surface of dielectric layer 2 is exposed to the outside.

It may be provided that regions (not shown) of substrate 1 on which, for example, CMOS circuit regions or other regions, not required as a MEMS structure, are covered by a protective layer.

Figure 1B:
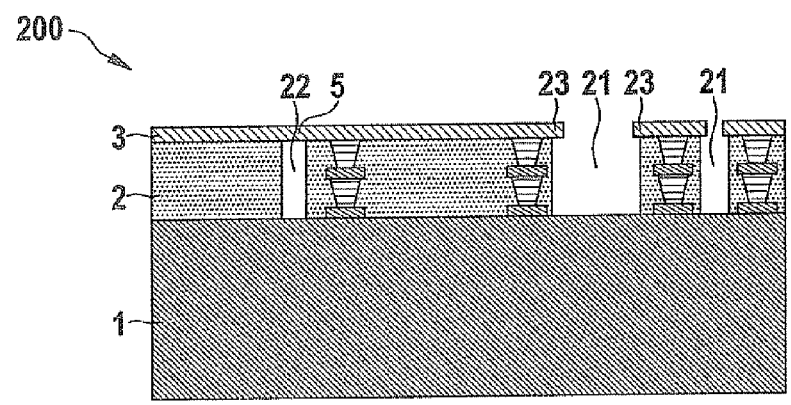

A second method step 200 is shown in FIG. 1b. With metal-plated layer 3 as a mask layer, depressions or trenches are initially introduced into dielectric layers 2. A plasma etching process may be used, with the aid of which preferably vertical etching flanks may be produced. In region 11 of exposed dielectric layers 2, trenches 21 are introduced down to main surface 1a of substrate 1. Trenches 21 may undercut an overhang 23 of metal-plated layer 3; i.e., the width of trenches 21 may be slightly greater than the width of the opening in region 11.

A trench 22 is likewise introduced into dielectric layers 2 in region 5 of metal-plated layer 3, in which thin metal-plated webs may be applied. Trench 22 is produced by undercutting the metal-plated webs in region 5 of trench structures which are situated outside the plane of the drawing of FIG. 1b. In this way, it may be achieved that a region of dielectric layers 2 between two trenches 22 and 21 is spatially separated from the remaining region of dielectric layers 2, while a connection of metal-plated layer 3 between these regions is still ensured by metal-plated webs 5. For this purpose, it may also be provided that an isotropic etching process or a combination of anisotropic and isotropic etching processes is used to completely or partially remove dielectric layers 2 beneath region 5.

When metal-plated webs 5 are located at a relatively great distance from main surface 1a of substrate 1, for example due to a relatively large number of metal-plated layers 4, 4a, 4b, 4c connected therebetween, complete undercutting of metal-plated webs 5 for forming trench 22 may be dispensed with. This is possible in particular when introducing trenches into substrate 1 beneath metal-plated webs 5 may be ensured in a subsequent method step.

Figure 1C:
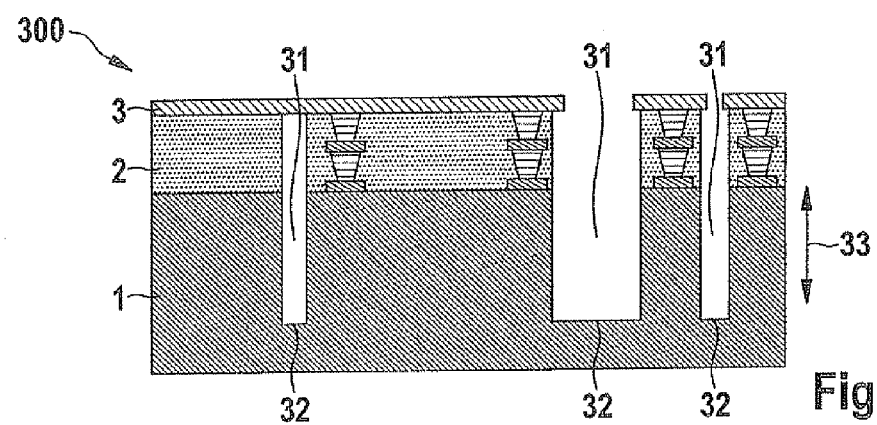

A further method step 300 is shown in FIG. 1c. With metal-plated layer 3 as a mask layer, further trenches 31 are introduced into substrate 1 in the region of trenches 21 and 22. Depth 33 of the trenches may be selected depending on the MEMS structures to be produced and their mechanical and/or electrostatic properties. For example, for introducing trenches 31, an anisotropic etching process such as a deep reactive ion etching (DRIE) process, for example, may be used. It is provided that trenches 31 are designed in such a way that metal-plated layer 3 is completely undercut in substrate 1 in region 5 of the metal-plated webs.

Figure 1D:
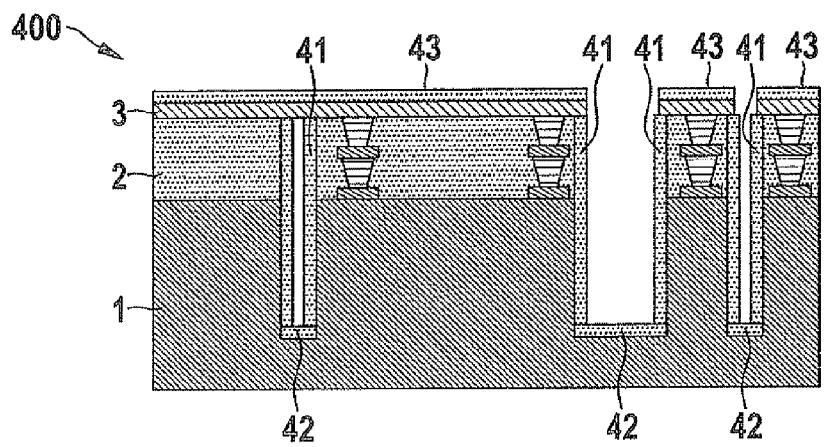

A further method step 400 is shown in FIG. 1d. Starting from the side of main surface 1a of substrate 1, a passivation layer is applied to the intermediate product. A passivation layer 43 is applied on a surface of metal-plated layer 3, a passivation layer 41 is applied on the side walls of trenches 31, and a passivation layer 42 is applied on base 32 of trenches 31. The passivation layer may, for example, include an oxide layer, or a polymer layer made of octafluorocyclobutane, for example.

Figure 1E:
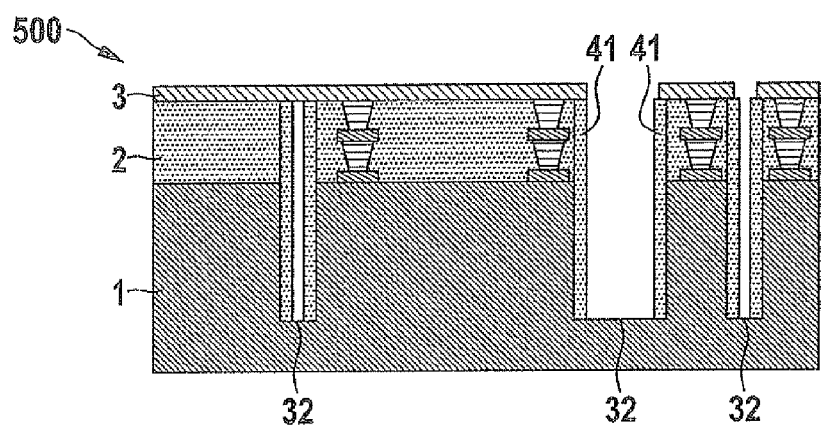

A further method step 500 is shown in FIG. 1e. Regions 42 and 43 of the passivation layer are removed. This may be achieved using an anisotropic etching process, for example. In particular, base 32 of trenches 31 is exposed.

Figure 1F:
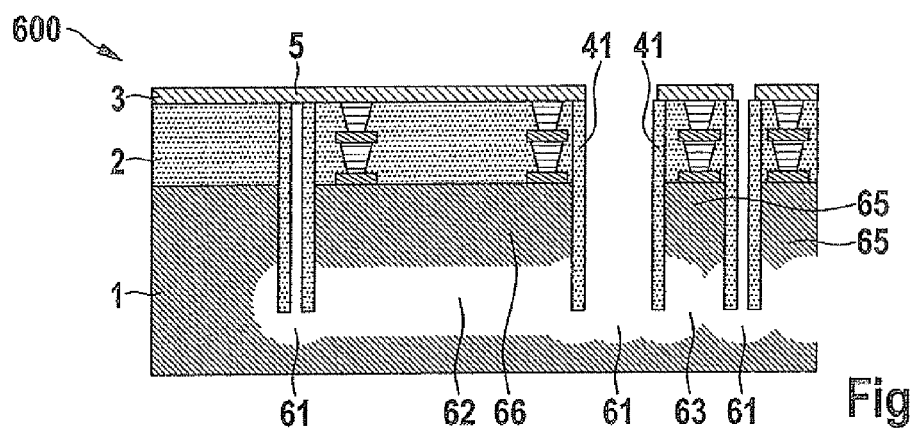

A further method step 600 is shown in FIG. 1f. Cavity structures 61, 62, 63 are formed inside substrate 1 via base 32 of trenches 31. An isotropic etching process or an isotropic gas phase process may be used for etching substrate 1. Starting from base 32 of a trench 31, an essentially spherical cavity structure 61 is formed which extends essentially uniformly beneath trench 31 inside substrate 1. It may be provided that cavity structures 61 of adjacent trenches 31 abut one another in a region 63 and form an opening. Such an opening may be provided to separate regions 65 above cavity structures 61 from the remaining substrate material, in particular to electrically insulate and to create exposed regions 65 in the process. It may also be provided that beneath regions 66, cavity structures 62 are produced which result from openings (not shown) in cavity structures 61 which abut one another outside the plane of the drawing of FIG. 1f in a direction perpendicular to the plane of the drawing. This may be ensured, for example, by metal-plated layer 3 having a sufficiently small width above region 66. Structures 66, made of substrate material, which are left open may thus be produced which are mechanically separated and electrically insulated from the remainder of substrate 1. Structure 66 is connected to the remainder of substrate 1, solely via metal-plated layer 3 in region 5 of the metal-plated webs and optionally, via other remainders of dielectric layers 2.

In another specific embodiment, it may be provided that cavity structures 61, 62, 63 are introduced into substrate 1 via a back-side process, i.e., from a side facing away from main surface 1a of substrate 1. It may also be provided that passivation layers 41 on the side walls of trenches 31 are removed after forming cavity structures 61, 62, 63.

FIG. 2 shows a top view of a MEMS structure according to another specific embodiment of the present invention. Intersection line I-II shows a cross section which is similar to the cross section shown in FIGS. 1a through 1f. In particular, the MEMS structure in FIG. 2 may be produced using a method according to the present invention, according to the method steps in FIGS. 1a through 1f.

The MEMS structure in FIG. 2 may, for example, be applied to a substrate. Structure patterns of a metal-plated layer 3 are shown which, for example, may correspond to metal-plated layer 3 in FIGS. 1a through 1f. However, it may also be provided that the MEMS structure is formed completely or partially from other metal-plated layers, for example metal-plated layers 4, 4a, 4b, 4c in FIGS. 1a through 1f. The MEMS structure may include webs 204a, 204b, 205a, 205b which are aligned parallel to one another. It may be provided that a plurality of webs 204a, 204b, 205a, 205b, in each case arranged in pairs, is provided. Three web pairs 204a, 205a, and 204b, 205b are shown in FIG. 2 as an example, although any other number of web pairs is also possible. It may also be provided that webs 204a and 204b, which are not paired with a web 205a and 205b, respectively, are provided. Webs 204a, 204b are advantageously connected to a main region 208a or 208b, respectively, of metal-plated layer 3 via metal-plated webs 206. Metal-plated webs 206 may correspond to the metal-plated webs in region 5 of FIGS. 1a through 1f. It may be provided that metal-plated webs 206 are arranged not only in a row, but also in such a way that they cover the largest possible area, within which webs 204a, 204b may be suspended in a mechanically stable manner.

Webs 204a, 204b, 205a, 205b span regions of the substrate material which are electrically and mechanically separated from the remainder of the substrate. These regions may in particular be regions which are similar to regions 66 in FIGS. 1a through 1f. Thus, webs 204a, 204b, 205a, 205b together with the substrate regions therebeneath may be used as electrodes having a large electrode surface area. Webs 204a and 204b and 205a and 205b may each be used as an electrode of a capacitive MEMS structure. In particular, the MEMS structures in FIG. 2 may be used as acceleration sensors. Electrodes 204a, 204b, 205a, 205b may be acted on by voltage via terminals 201, 202, 203. Two webs 204a, 205a and 204b, 205b form a capacitive sensor element. A capacitance of the sensor element between two webs 204a, 205a and 204b, 205b is a function, among other things, of the distance between the two webs in the y direction. The middle electrode having terminals 202 is mechanically freely mounted via an equalizing structure 207. Thus, during an acceleration in the y direction, structure 209 may be deflected in the y direction due to the mass inertia of structure 209, while webs 204a and 204b undergo little or no deflection in the y direction due to their rigid suspension via metal-plated webs 206. As a result, the distance between a web pair 204a, 205a decreases to a degree that is comparable to the distance between a web pair 204b, 205b. This change in distance is reflected in a change in capacitance, which may be evaluated by differential analysis of electrode terminals 201 and 202 or 202 and 203.

Figure 3:
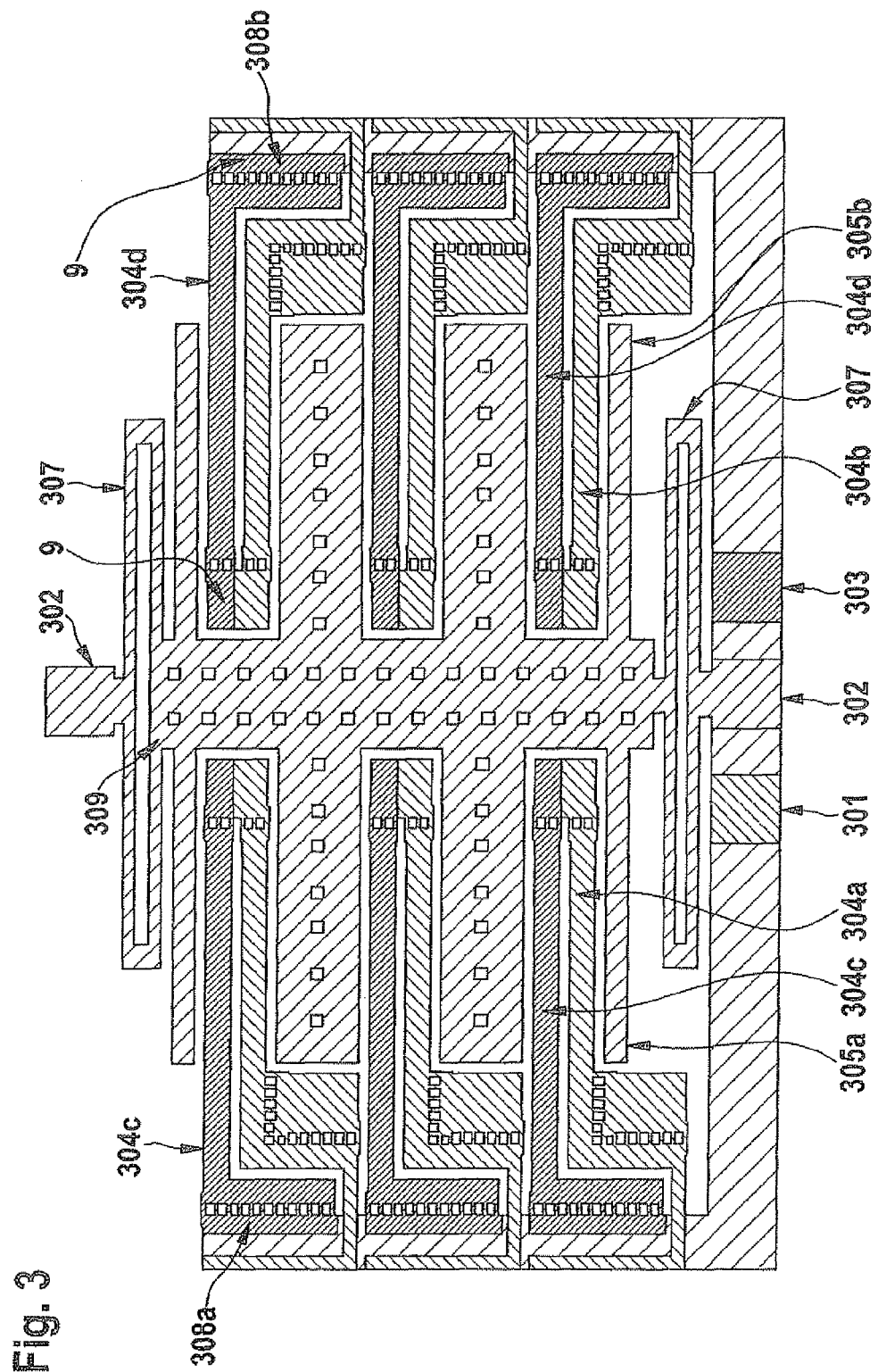
FIG. 3 shows a top view of a MEMS structure according to another specific embodiment of the present invention.

FIG. 3 shows a top view of a MEMS structure according to another specific embodiment of the present invention. The MEMS structure in FIG. 3 differs from the MEMS structure in FIG. 2 essentially in that webs 304a, 304b, 304c, 304d of the stationary electrodes in two regions 9 are connected to main regions 308a, 308b of the stationary electrodes via metal-plated webs. This advantageously results in higher mechanical stability of webs 304a, 304b, 304c, 304d of the stationary electrodes.

What is claimed is:

1. A method for producing microelectromechanical structures in a substrate, comprising:
arranging at least one metal-plated layer on a main surface of the substrate in a structure pattern;
leaving substrate webs open beneath the structure pattern region by introducing first trenches into the substrate perpendicular to a surface normal of the main surface in a region surrounding the structure pattern;
coating the walls of the first trenches perpendicular to the surface normal of the main surface with a passivation layer; and
introducing cavity structures into the substrate at the base of the first trenches in a region beneath the structure pattern region.

2. The method as recited in claim 1, further comprising:
forming metal-plated webs within the metal-plated layer for electrically connecting the structure pattern region to the substrate, the width of the metal-plated webs being smaller than the width of the structure pattern region; and
completely undercutting the metal-plated webs during introduction of the first trenches into the substrate.

3. The method as recited in claim 1, wherein:
the substrate is a silicon substrate;
at least one of the first and second trenches is introduced using an anisotropic ion etching process; and
the cavity structures are introduced using one of an isotropic plasma etching process or an isotropic gas phase process.

4. A semiconductor device, comprising:
a substrate having a main surface;
a first microelectromechanical structure element having a first metal-plated layer and a first substrate web situated beneath the first metal-plated layer, wherein the first substrate web is electrically decoupled from the substrate; and
at least one metal-plated web narrower than the first microelectromechanical structure element, wherein the metal-plated web mechanically couples the first microelectromechanical structure element to the substrate.

5. The semiconductor device as recited in claim 4, further comprising:
a second microelectromechanical structure element having a second metal-plated layer and a second substrate web situated beneath the second metal-plated layer, wherein the second substrate is electrically decoupled from the substrate, and wherein the second microelectromechanical structure element is movable with respect to the first microelectromechanical structure element, and wherein the first microelectromechanical structure element and the second microelectromechanical structure element form a capacitive sensor element.

* * * * *